July 12, 1966 G. H. ELLIOTT ETAL 3,260,981

COMPONENT TERMINATIONS

Filed Oct. 14, 1963

INVENTORS
GEORGE H. ELLIOTT
HAMMOND E. T. GOWEN
BY R. E. Geangue
ATTORNEY 3,260,981
Patented July 12, 1966

3,260,981

COMPONENT TERMINATIONS

George H. Elliott, Van Nuys, and Hammond E. T. Gowen, Escondido, Calif., assignors to Atohm Electronics, Sun Valley, Calif., a corporation of California Filed Oct. 14, 1963, Ser. No. 316,086
9 Claims. (Cl. 338—313)

This invention relates to electrical terminals and more particularly to novel means and method for making terminations for electrical components such as resistors, etched circuit conductors, semiconductor devices, and the like.

As is well known to those versed in the art, considerable effort has been directed to the miniaturization, subminiaturization and micro-miniaturization of electronic components. In furtherance of this effort, widespread use has been made of printed or etched circuit elements as well as encapsulating techniques. To optimize the benefits of these techniques, it is, of course, necessary to reduce the size of the circuit components and mechanical assemblies as far as possible within practical limits. The importance of size is particularly significant in regards to mechanical and/or physical characteristics of terminal structures and other means for making the necessary electrical interconnections between circuit components. Frequently this has led to specialized connecting means which may only be used under specific installation conditions. Generally speaking, the development of component terminations or interconnecting means has not kept pace with the refinement and/or size reduction of the component elements themselves. A simple scaling down of old and well-known component terminations has reached practical limitations.

Another area of development of electronic components has been towards the automatic manufacture or automation of components and circuit elements. Ideally, circuit and/or component terminals should lend themselves to automatic manufacturing techniques.

By the present invention, there is provided a novel and improved component termination structure and method therefor which is particularly adapted to miniaturization and to automatic manufacture. The invention resides partly in the physical construction of the component termination and its interrelationship with the component itself as herein specifically illustrated, but also embraces the method of manufacture of the terminal itself independently of the structural details of its several parts.

In addition to problems of miniaturization and automatic manufacture, the problem of obtaining high reliability of circuit terminals and freedom from drift, or changes in circuit resistance due to adverse environmental effects has received the attention of many investigators. By the present invention, there is provided a novel and improved component termination having excellent immunity to the effects of adverse environmental conditions.

It is therefore, a principal object of the invention to provide a novel and improved component termination and method of manufacture therefor.

Another object of the invention is to provide a novel and improved electrical component termination which is particularly adapted for use with sub-miniaturized and/or micro-miniaturized circuit conductors and/or circuit components.

Yet another object of the invention is to provide a novel and improved component termination which is relatively free from drift effects and/or changes due to adverse environmental conditions.

Still another object of the invention is to provide a novel method for effecting electrical connection to and between electrical circuit conductors and/or electrical circuit compnents.

Another object of the invention is to provide a new and improved electrical termination which overcomes disadvantages of previous means and methods heretofore intended to accomplish generally similar purposes.

Other objects of the present invention will in part be obvious and will in part appear hereinafter.

The invention will be understood more completely from the following detailed description, taken in connection with the drawings, in which.

Figures 1, 2, 3, 3A, 4, 4A, 5, 6, 7, 8, 9, 10, 11, 12, 13, 14, 15, 16, 17, 18:
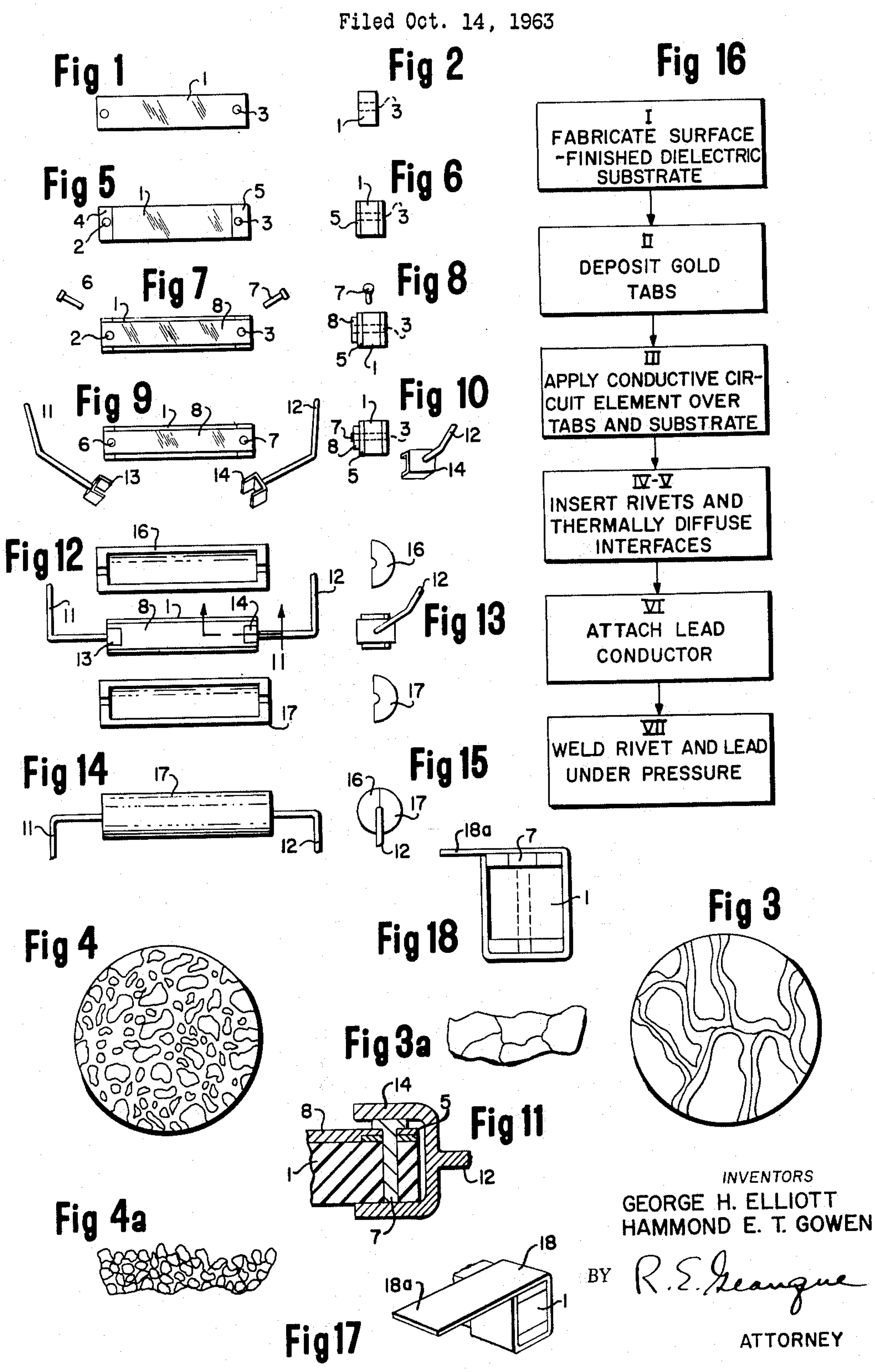
FIGURE 1 is a plan view of a dielectric substrate member to which a termination according to the invention may be applied.
FIGURE 2 is an end view of the member of FIGURE 1.
FIGURE 3 illustrates the surface condition of a typical steatite substrate as magnified 1500 to 2000 times.

FIGURE 3*a* is a cross-section of the substrate material shown in FIGURE 3;

FIGURE 4 illustrates the surface condition of a typical alumina substrate as magnified 1500 to 2000 times;

FIGURE 4*a* is a cross-section of the alumina substrate material of FIGURE 4;

FIGURE 5 illustrates the member of FIGURE 1 to which is applied a conductor film;

FIGURE 6 is an end view of the member of FIGURE 5;

FIGURE 7 is a plan view of the member of FIGURES 1 and 5 to which a resistive film has been applied;

FIGURE 8 is an end view of the device of FIGURE 7;

FIGURE 9 shows the lead and saddle structures to be applied to the device of FIGURE 7;

FIGURE 10 is an end view of the device of FIGURE 9;

FIGURE 11 is a cross-section view showing the manner of installation of the several elements of FIGURES 9 and 10;

FIGURE 12 is a plan view illustrating the cover elements for the device of FIGURE 11;

FIGURE 13 is an end view of the apparatus of FIGURE 12;

FIGURE 14 illustrates the completed device manufactured according to the invention;

FIGURE 15 is an end view of the device of FIGURE 14;

FIGURE 16 is a block diagram setting forth the steps in the method of manufacture and assembly of an electrical termination according to the invention;

FIGURE 17 illustrates an alternative embodiment of the invention;

FIGURE 18 is a cross-section of the device of FIGURE 17.

The useful applications of a component termination of the present invention are many, one of which being its use as terminals for a film resistor. It should be understood, however, that the application of the component terminations to a film resistor as described hereinafter is merely exemplary. Looking now at FIGURE 1 there is shown an insulating substrate 1 which serves as a base member to support the resistive circuit element comprising the resistor. This substrate comprises a rectangular strip of ceramic material having a length several times its width, and is preferably wider than it is thick. The substrate member is preferably formed from steatite by dry-press or molding techniques to provide a natural finish surface without further processing. Preferably, the substrate is fabricated so that a pair of holes 2 and 3 are integrally formed therein. Holes 2 and 3 are located near opposite ends of substrate 1 and pass entirely through the substrate, as can be seen in FIGURE 2. These holes are preferably of uniform diameter from end to end. If dry-press molding is used to form substrate 1, the die mold may be provided with inserts to form holes 2 and 3 during the molding process in a well-known manner, as will be readily understood by those skilled in the art.

While it is preferred that substrate 1 be comprised of steatite, almost any insulating material having sufficient mechanical strength to support the circuit element may be used. As can be seen in FIGURE 3, a typical steatite has a relatively smooth natural finish which is free from gross pits and/or granules. The surface shown in FIGURE 3 is magnified 1500 to 2000 times, and granules larger than one micron ($39\times10^{-6}$ inches) are considered "gross". As can be seen in FIGURE 3*a*, a cross-section through this material indicates it to be free of micro-fissures and is impervious to water absorption. An unusable material is illustrated in FIGURES 4 and 4*a* wherein is shown a typical alumina magnified 1500 to 2000 times.

After the first step of fabricating the surface-finished substrate has been completed, a pair of gold tabs 4 and 5 are deposited on the substrate 1. These tabs each comprise a film of "squeegee burnish" gold (23 k. or better) which extend across the width of the substrate and completely surround the holes 2 and 3. The gold film is fired onto the steatite substrate and preferably should be in the range of $5\times10^{-7}$ to $1\times10^{-5}$ inches thick. Since the gold should adhere to the substrate 1, the surface should be properly fluxed before depositing the film. Suitable fluxing techniques are well-known to those versed in the art and accordingly are omitted in the interest of clarity and brevity.

Tabs 4 and 5 are applied to the top surface only, of substrate 1. The central portion of the upper surface of the substrate 1 is masked off and a gold film is deposited onto the unmasked portion at each end of the substrate, as shown in FIGURE 5. It is important to note that the gold film is deposited so that it completely surrounds the hole in the substrate.

The edges of the upper surface of substrate 1, running lengthwise, are then masked and a resistance film 8 is deposited along the exposed length of the upper surface of the substrate and over the gold tabs 4 and 5. The thickness of film 8 is determined by the desired resistance properties. Any suitable technique may be employed for depositing the resistance film. It is important to note that the gold tabs are put down under the resistance film. A suitable technique is shown and described in copending application Serial No. 58,144 entitled "Controlled Deposition and Growth of Polycrystalline Films in a Vacuum," filed Sept. 23, 1960, and assigned to the same assignee as the present invention.

While the particular example described herein relates to a metal-film resistor, it should be understood that similar procedures can be employed in the fabrication of terminals for semiconductors, microminiature circuits, etc.

By way of example only, and for the purpose of indicating relative sizes of the several parts, assume that the substrate 1 is 0.290 inch long, 0.085 inch wide, and 0.040 inch thick. In this instance, the gold tab 4 and 5 would each extend 0.040 inch inward from the ends of the substrate 1. Holes 2 and 3 would be 0.015 inch in diameter. A pair of slugs or rivets 6 and 7 are formed from a precious metal alloy wire, preferably 75% gold and 25% palladium. Rivets 6 and 7 are plated with electroless gold after fabrication. Electroless gold plating is preferred in order to obviate difficulties arising from micropores and entrapment encountered with electroplating techniques. Rivets 5 and 6 each have a small head 0.003 inch thick and 0.020 inch in diameter; the shank of the rivet is 0.014 inch in diameter. These rivets are designed to easily slip into holes 2 and 3 and the heads are kept to a minimum thickness consistent with the desired structural properties, as will become apparent hereinafter. The shanks of the rivets are 0.044 inch long. The plated rivets 6 and 7 are inserted in the holes 2 and 3, and the entire structure assembled thus far is heated up to a temperature sufficient to diffuse the gold interstitially between the crystals of the resistance film 8.

If the film 8 comprises a highly reactive material, the structure is heated in a vacuum. If ordinary materials are employed for film 8 then the structure may be heated in air. In a practical resistor construction the single crystals comprising the film are effected by heat up to about 400° C. If the structure is heated to between 400° and 500° C. for a period of twenty to twenty-five minutes, the gold will completely diffuse through and around the crystals comprising the resistance film.

It is important to note at this point that the ideal contact comprises a thermally diffused contact. Platinum, lead and similar materials have low diffusion properties and will not diffuse properly. Therefore, gold is the only practical material to use in this application.

A pair of lead wires 11 and 12 and saddles 13 and 14 are shown in FIGURES 9 and 10. Lead wires 11 and 12 may be fabricated from a nickel-copper or nickel-chrome alloy having a relatively high resistance as compared with the saddles. Lead wires 11 and 12 may have a diameter of 0.025 inch. Each lead wire (11 and 12) is resistance welded to a corresponding saddle 13 and 14. Each saddle comprises a channel-shaped member having an opening of a dimension which will snugly engage the end of the substrate 1 and engage the top of the rivet head. FIGURE 11 is an elevational view illustrating this structural arrangement. The saddles 13 and 14 are fabricated from a copper-nickel alloy of relatively low resistance and are resistance welded to the rivet. Before welding to the rivet, the saddle and lead wire assembly is plated with electro-less gold. The thickness of the material comprising the saddle may be of the order of 0.005 inch, and the spacing between the U-shaped sides of the saddle may be 0.040 inch.

During welding of the saddle (13 or 14) to the rivet (6 or 7), sufficient pressure is applied to the structure, and enough electrical energy is supplied from the resistance welder, to make the weld and also to soften the rivet body within the hole (2 or 3). As was stated hereinabove, the rivet is of slightly less diameter than the hole in order to provide a slip clearance and facilitate assembly. However, when the rivet is softened during the resistance welding operation, and placed under pressure, it will entirely fill up the hole. In addition to preventing the rivet from dropping through the hole, the head also serves to make contact with the diffused end of the resistance film, thus the rivet makes an annular contact with the gold diffused portion of the film 8 and because of the energy put into the welding operation it approaches the melting point of the gold, thereby providing double diffusion. By double diffusion, it is means that the gold is diffused once into the film 8 and is again diffused when the rivet is heated. This will cause the gold to diffuse back through, and into, the diffused path. Also, the gold on the surface of the substrate will also slightly diffuse into the rivet; as a result, a completely diffused weld will comprise the terminal contact.

When the rivet cools, following the welding operation, it shrinks and mechanically applies pressure to the whole structure. The ceramic substrate, due to its lower thermal conductivity, will not have time to heat up during welding, as has the gold. Thus, there is provided a tight mechanical pressure. There will also be thoroughly diffused gold between every conductive element. Thus, no solder or other materials are employed which might result in undesirable electrical characteristics.

As can be seen, the procedure to this point has provided a gold tab which is tenaciously bonded to the substrate and to the resistive film, and all conductive elements have diffused gold interfaces. It merely remains necessary to provide a suitable protective covering over the structure. As shown in FIGURES 12 and 13, a two-part molded cover may be used to house the above-described assembly. The housing or protective cover comprises two semi-cylindrical shells 16 and 17. The overall diametral dimension may be 0.125 inch, and the overall length may be 0.375 inch. These shells may be molded from plastic or other suitable material, and preferably has a coefficient of expansion matching that of the substrate 1. Both halves of the housing (shell) are identical. The hollow interior of the assembled housing is shaped to conform to the exterior shape of the substrate 1 and its assembled parts (4–8 and 11–14). The ends of the shells 16 and 17 have a circular notch or relieved area through which lead wires 11 and 12 may pass. Shells 16 and 17 are fused together with a silicon or epoxy adhesive, depending upon the temperature range desired. Preferably, the two parts of the housing (16 and 17) are put under a slight amount of pressure while the adhesive sets up. Preferably, the adhesive material fills the space between the housing and the substrate assembly to afford further protection.

The completed resistor is shown in FIGURES 14 and 15.

The dimensions and part configurations given above are merely by way of example. Many modifications within the intended scope of the invention are possible. For example, lead wires 11 and 12 may be omitted or replaced with other types of circuit conductor means, depending upon particular application requirements. Furthermore, saddles 13 and 14 may be functionally combined with lead wires 11 and 12, by means of the modification shown in FIGURES 17 and 18. In this embodiment, gold or gold-plated tape or flat ribbon 18 is wrapped once around the end of the substrate 1 with its free end 18*a* extended as a lead. The ribbon 18 is spot welded to rivet 7 and double diffused as in the first-mentioned embodiment.

In the fabrication of other types of components, according to the method of the present invention, the vacuum deposited film 8 may be replaced by circuit elements produced by sputtering, photoetching, silk screening, and/or printed circuit techniques applied in a conventional and well-known manner.

The particular housing shown is merely by way of example, and other means to provide mechanical protection may be employed. For example, a ceramic or porcelain glaze may be placed over the assembled article.

In order to more clearly point up the method aspect of the invention, the several steps comprising the implementation of a component termination will now be considered. These steps are illustrated in FIGURE 16. Step I comprises fabrication and surface finishing of the dielectric substrate. This substrate may be of any suitable configuration such as a strip, plate, rod, disc or other insulating support of suitable strength and dimensions. The hole for receiving the slug or rivet is provided, preferably as an integral part of step I. If necessary, the hole may be made in the substrate as a separate step.

Step II comprises depositing or applying a high-purity gold tab of appropriate surface shape and area directly onto the surface of the dielectric substrate surrounding the hole therein. Preferably the gold tab is fired onto the substrate, if the characteristics of the substrate permit.

Step III comprises the application of the active circuit conductor element onto the substrate and over the gold tab.

Step IV comprises the insertion of a gold slug or rivet into the hole so that its head provides an annular surface contact with the active circuit conductor element, and its shank contacts the portion of the gold tab surrounding the hole.

Step V comprises heating the assembled substrate, conductor element, and rivet to a temperature, and for a time, sufficient to cause the thermal diffusion of the gold between all of the conductive interfaces.

Step VI comprises the application of a gold tape, ribbon, or saddle, to the head and shank ends of the rivet.

Step VII comprises welding of the gold tape, ribbon, or saddle to the rivet, under pressure, to provide mechanical attachment therebetween and double diffusion of the gold between all of the conductive surfaces.

Optionally, a final step may comprise the enclosing of the assembly within a protective covering.

The end result of the above-described method is a component termination which has both excellent mechanical and electrical properties, and which may be scaled down to minute sizes. The simple nature of the steps involved lend themselves ideally to automatic manufacturing methods. Thus, there is provided by the present invention, the objects set forth at the beginning of this specification.

Without further analysis, the foregoing will so fully reveal the essential subject matter of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. A component termination comprising:

a dielectric substrate having a hole passing therethrough;

a layer of gold deposited on the portion of said substrate surrounding said hole;

a circuit conductor element applied to said substrate and over said gold layer;

gold rivet means inserted into said hole whereby the head of said rivet means contacts said circuit element and the shank of said rivet means contacts the portion of said gold layer surrounding said hole;

a lead conductor means having a gold surface, said conductor means extending from the shank end of said rivet means exteriorly of said substrate and over the head of said rivet means; and all of the interfaces between said gold layer, said conductor element, said rivet means and said lead conductor means being thermally diffused.

2. A component termination as defined in claim 1 wherein said substrate comprises a natural-finished steatite member having no surface irregularities substantially larger than one micron, thereby providing a continuous supporting base for said gold layer.

3. A component termination as defined in claim 1 including a lead wire attached to a point intermediate of the ends of said lead conductor means and extending exteriorly of said substrate whereby electrical connection may be made between said termination and an external circuit.

4. A component termination as defined in claim 3 wherein said lead conductor means comprises a channel-shaped saddle member, one end of which abuts said shank end and the other end of which abuts said head of said rivet means, and said lead wire extends from the intermediate portion of said saddle member.

5. A component termination as defined in claim 3 wherein said lead conductor means comprises a gold alloy tape, one end of which abuts said shank end and the other end of which abuts said head of said rivet means.

6. A component termination comprising:

a dielectric sheet having a hole passing therethrough adjacent one edge thereof;

a layer of gold deposited on the portion of said substrate surrounding said hole;

a film of conductive material applied to at least a portion of one surface of said sheet and over said gold layer;

a gold slug inserted into said hole and extending from the upper surface of said film to the other surface of said sheet; and contacting the portion of said gold layer surrounding said hole; and a strip of gold, one end of which abuts said slug at said upper surface, and the other end of which abuts said slug at said other surface; all of the interfaces between said gold layer, said film, said slug, and said gold strip being thermally diffused.

7. In a metal film resistor, having a resistance film deposited on a dielectric substrate, a component termination comprising:

a high-purity gold tab deposited on a portion of the substrate and in surface contact with a portion of the resistance film;

a conductive slug having an annular projection in surface contact with said resistance film and a shank portion extending through said substrate;

a channel-shaped saddle conductor extending from one end of said shank portion, around an edge of said substrate and over said annular projection of said slug; the conductor interfaces between said resistance film, said tab, said slug, and said saddle being thermally diffused.

8. In a metal film resistor, having a resistance film deposited on a dielectric substrate, a component termination comprising:

a high-purity gold tab deposited on a portion of the substrate and in surface contact with a portion of the resistance film;

a conductive slug having an annular projection in surface contact with said resistance film and a shank portion extending through said substrate; and a ribbon conductor having a high-purity gold surface, extending from said shank portion around an edge of said substrate and over said annular projection of said slug, the conductor interfaces between said resistance film, said tab, said slug, and said ribbon conductor being thermally diffused.

9. The method of making a component termination comprising the steps of fabricating a surface dielectric substrate having a hole therethrough, comprising the steps off:

depositing a layer of high-purity gold onto said substrate surrounding said hole;

applying a conductive circuit element over said layer in the region of said hole and over at least a portion of said substrate;

inserting a slug having at least a gold surface into said hole;

thermally diffusing the gold into all of the conductive interfaces of said layer and of said slug; and welding a gold-surfaced conductor lead from one end of said slug to the other end of said slug under pressure, whereby said lead thermally diffuses into said slug.

References Cited by the Examiner

UNITED STATES PATENTS

| | | | |
|---|---|---|---|
| 2,953,484 | 9/1960 | Tellkamp -------- | 338—308 X |
| 3,207,838 | 9/1965 | McCormack ------- | 29—155.5 |

WHITMORE A. WILTZ, *Primary Examiner.*

W. I. BROOKS, *Assistant Examiner.*